United States Patent
Payne

(10) Patent No.: US 9,876,630 B2
(45) Date of Patent: Jan. 23, 2018

(54) EMBEDDED CLOCK IN DIGITAL COMMUNICATION SYSTEM

(71) Applicant: Texas Instruments Incorporated, Dallas, TX (US)

(72) Inventor: Robert Floyd Payne, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/978,381

(22) Filed: Dec. 22, 2015

(65) Prior Publication Data

US 2017/0180113 A1    Jun. 22, 2017

(51) Int. Cl.
*H04B 3/00*  (2006.01)
*H04L 7/027*  (2006.01)
*H04L 25/02*  (2006.01)
*H04L 1/00*  (2006.01)
*H04L 7/00*  (2006.01)
*H04L 25/14*  (2006.01)

(52) U.S. Cl.
CPC ............ *H04L 7/027* (2013.01); *H04L 1/0045* (2013.01); *H04L 7/0079* (2013.01); *H04L 7/0091* (2013.01); *H04L 25/026* (2013.01); *H04L 25/0272* (2013.01); *H04L 25/14* (2013.01)

(58) Field of Classification Search
CPC ........................................................ H04L 7/027
USPC ............................................................. 375/257
See application file for complete search history.

(56) References Cited

U.S. PATENT DOCUMENTS

2008/0288201 A1* 11/2008 Oettinger ............... H02M 3/157
702/109
2016/0119118 A1* 4/2016 Shokrollahi ........ H04L 25/0276
375/376

* cited by examiner

*Primary Examiner* — Lihong Yu
(74) *Attorney, Agent, or Firm* — John R. Pessetto; Charles A. Brill; Frank D. Cimino

(57) ABSTRACT

A digital receiver for decoding input data having three states includes a first input coupled to a first data line, a second input coupled to a second data line, a third input coupled to a third data line, and a fourth input coupled to a fourth data line. A first decoder is coupled to a first output, wherein the first decoder is for outputting first data signals in response to the sign of input data on the first data line minus input data on the second line. A second decoder is coupled to a second output, wherein the second decoder is for outputting second data signals in response to the sign of input data on the third data line minus input data on the fourth data line.

3 Claims, 7 Drawing Sheets

EMBEDDED CLOCK IN DIGITAL COMMUNICATION SYSTEM

BACKGROUND

Processors, such as digital and mixed-signal processors require digital data communications between various processing, storage, and interface (input/output) subsystems in the processors. As the required data communication rates increase, such as to the terabit/sec range, the complexity, area, and power of interface circuits between these subsystems also increases.

At a high level, two techniques are generally used for data communications. The first technique uses many parallel data lines in addition to a clock. The second technique uses serializer/deserializer (SerDes) technology. The parallel data communication technique includes a plurality of buffers for boosting the data signals. The buffers draw large dynamic currents from a power supply, which cause power supply noise due to finite impedance of the power delivery network. Therefore, the parallel communications techniques are not desirable for many high speed communications.

SerDes techniques are very complex and result in significant design effort, consumption of die area, and power. Additionally, the SerDes techniques potentially add many points of failure to the processors in which they are located. The SerDes systems are therefore typically used at the boundaries of circuits for off-die interconnects and are typically not compatible with communications in a die constituting a processor.

SUMMARY

A digital receiver for decoding input data having three states includes a first input coupled to a first data line, a second input coupled to a second data line, a third input coupled to a third data line, and a fourth input coupled to a fourth data line. A first decoder is coupled to a first output, wherein the first decoder is for outputting first data signals in response to the sign of input data on the first data line minus input data on the second line. A second decoder is coupled to a second output, wherein the second decoder is for outputting second data signals in response to the sign of input data on the third data line minus input data on the fourth data line.

DETAILED DESCRIPTION

Processors, such as digital and mixed-signal processors, use high speed digital data communications to transfer data between various processing, storage, and interface (input/output) subsystems in the processors. Two techniques are generally used for data communications. The first technique is a parallel system that includes many parallel data lines in addition to a clock signal operating on a separate data line. A second technique uses serializer/deserializer (SerDes) technology for serial data transmissions.

Figure 1:
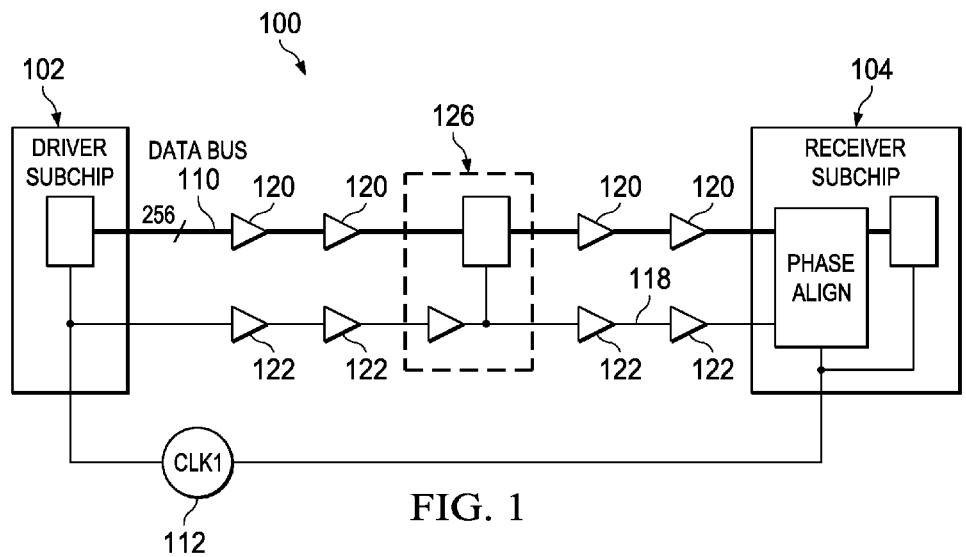
FIG. 1 is a block diagram of a parallel data communication system.

FIG. 1 is a block diagram of a parallel data communication system 100. The system 100 includes a driver subchip 102 and a receiver subchip 104 as may be implemented in a system on chip (SOC) or multi-core processor. Many of the communication techniques described with reference to FIG. 1 additionally apply to systems where data must travel off the die between two chips on an integrated system in package (SIP) or between two packaged chips communicating on a system board.

A data bus 110 carries data between the driver subchip 102 and the receiver subchip 104. In the example of FIG. 1, the data bus 110 is 256 bits wide, meaning that it contains 256 parallel wires or other conductors. A global clock buffer or clock tree 112 distributes a clock signal to both the driver subchip 102 and the receiver subchip 104. The clock signal is used to "clock out" data and provides a clock signal on a clock line 118 coupled between the driver subchip 102 and the receiver subchip 104. When the routing distance between the driver subchip 102 and the receiver subchip 104 is large and the data rates on the data bus 110 are high, the parasitic resistance and capacitance on the interconnects between the driver subchip 102 and the receiver subchip 104 limit the bandwidth and maximum data rates. In some examples, when the routing distances are 1.0 mm to 1.5 mm and the data rates are 500 Mb/s to 1500 Mb/s, the parasitic resistance and capacitance on the interconnects between the driver subchip 102 and the receiver subchip 104 limit the bandwidth and maximum data rate on the data bus 110.

In order to improve the data rates, buffers 120 are inserted into the data bus 110 between the driver subchip 102 and the receiver subchip 104 to re-drive the data on the data bus 110. Buffers 122 also re-drive the clock signal on the clock line 118 between the driver subchip 102 and the receiver subchip 104. In some examples, the data bus 110 is re-timed as indicated by the circled block 126. In some complex systems on a chip (SOC), there are multiple functional blocks each connected by these parallel data buses and often spanning large (multiple millimeters) distance. These long distances may require millions of buffers 120, 122 to boost the data and clock signals. This high number of buffers 120, 122, along with the large width of the data bus 110 consumes significant die area. The buffers 120, 122 also consume significant power, reaching over 5 W on some systems. The buffers 120, 122 are typically fabricated with CMOS inverters that have an output voltage swing between 0V and the power supply voltage for the system 100, which is typically 0.8V to 1.2V. Accordingly, the inverters draw large dynamic currents from the power supply, which results in supply noise due to the finite impedance of the power delivery network. Therefore, the use of the buffers 120 and 122 is not desirable for high speed data busses.

Figure 2:
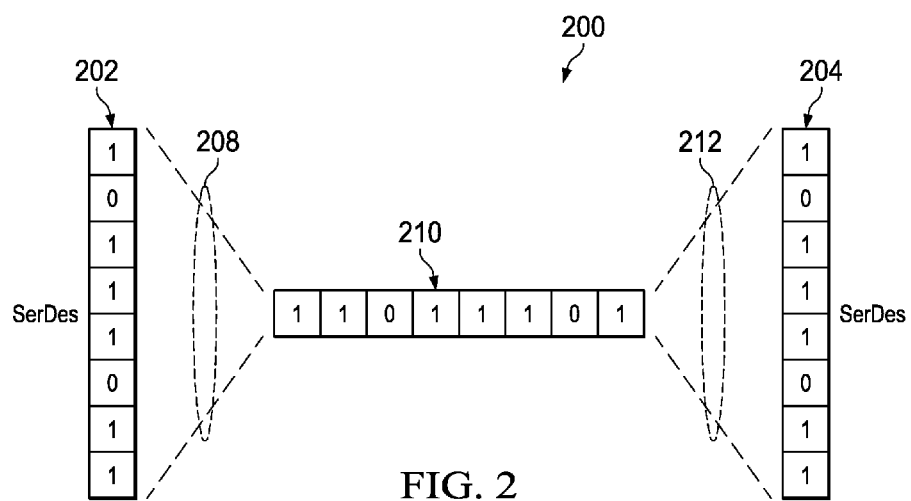
FIG. 2 is a block diagram of a communication system using serializer/deserializer (SerDes) technology.

FIG. 2 is a block diagram of a communication system 200 using serializer/deserializer (SerDes) technology. The system 200 increases data rates by combining multiple streams of lower speed parallel data into single higher speed serial data streams. The system 200 includes a driver subchip 202 and a receiver subchip 204 that input and output parallel data, respectively. In the example of FIG. 2, the parallel data has eight bits or channels. The parallel data generated by the driver subchip 202 is serialized into serial data by a serializer 208. The serial data is transmitted to the receiver subchip 204 by a high speed serial data line 210. The serial data line 210 has to operate at the number of parallel channels faster than the data rate of the parallel channel. The serial data is deserialized to parallel data by a deserializer 212 for processing by the receiver subchip 204.

Some examples of SerDes systems including clock generation and recovery circuits, data line drivers, test circuits, receivers, and other devices that are not shown in FIG. 2. These SerDes systems are very complex compared to the parallel communication systems. The complexity of SerDes systems results in significant design effort, consumption of die area and power, and potentially adds many points of failure in the system 200. These systems are therefore typically used at the boundaries of chips for off-die interconnect and rarely find use in on-die communication.

The circuits and methods described herein overcome the issues with parallel and SerDes communications systems. The circuits and methods eliminate the SerDes functions and embed the clock signals in the data stream using four wires or conductors and three signaling levels −1, 0, and +1. The clock signal and two bits of data are transmitted simultaneously on the four wires.

By enabling the three voltage signaling levels −1, 0, +1 on four wires referred to as A, B, C, and D, it is theoretically possible to have 81 ($3^4$) different signal combinations. In the examples described herein, the number of signal combinations is limited to those that are "differential-like," meaning those where the sum of the voltage levels on all four wires is equal to zero.

Figure 3:
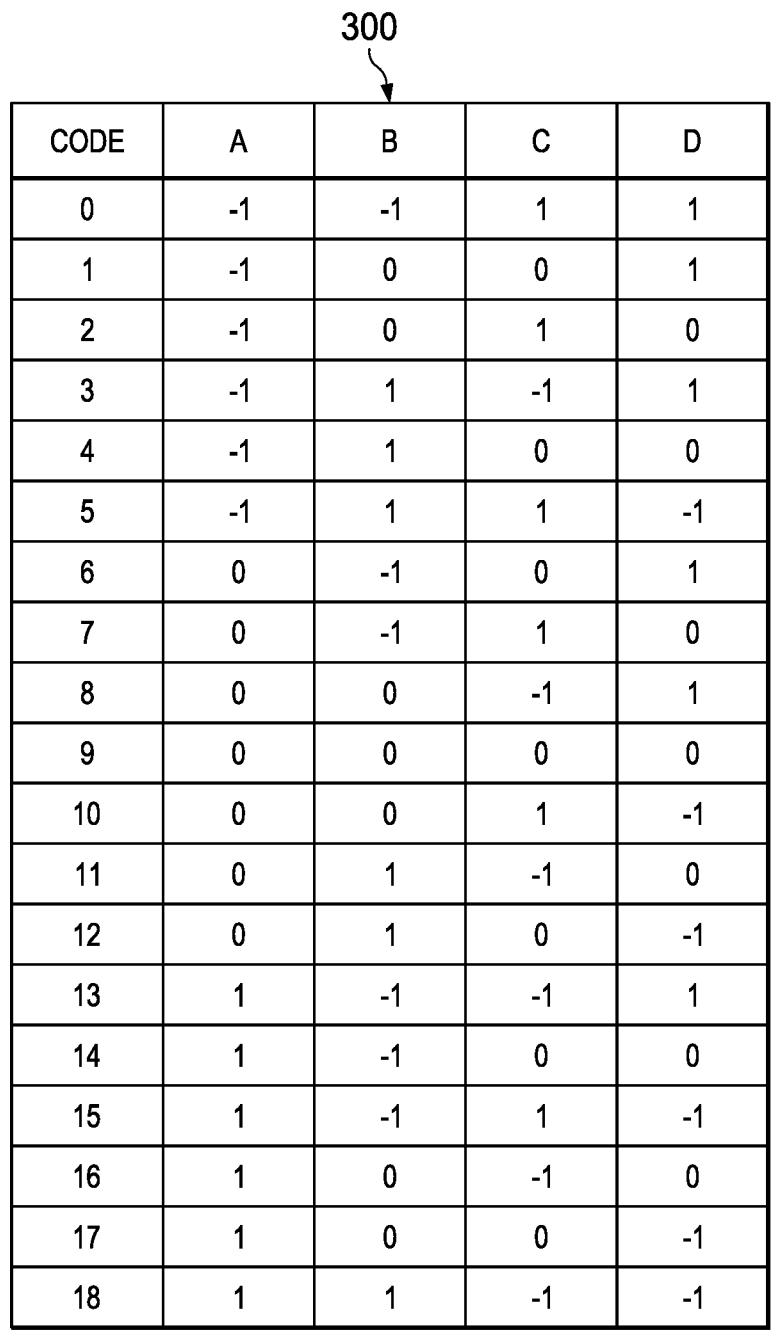
FIG. 3 is a chart showing the 19 combinations or codes that are differential for a four wire communication system having three signal levels per wire.

FIG. 3 is a chart 300 showing the 19 combinations or codes (labeled codes 0-18) of voltage levels that exhibit the differential-like trait described above. As shown by the chart 300, the sums of all the signals for the 19 codes add to zero. When the sum of the signals is equal to zero, external interaction due to electromagnetic interference (EMI) is minimized. The minimized EMI maintains many of the desirable characteristics of differential signaling, such as preventing erroneous signals being generated due to the EMI.

In one example, the sign of a function C−D determines whether a data bit, referred to as D0, is a logic 1 or logic 0. The function C−D refers to the value of a signal or voltage on the C wire minus the value of a signal or voltage on the D wire. For example, if sign(C−D)>0 then D0=1 and if sign(C−D)<0 then D0=0. If sign(C−D)=0, then D0=X, which is referred to as being logically undefined. Further to this example, sign(A−B) is used to convey whether a second data bit, referred to as D1, is a logic 1 or logic 0. If sign(A−B)>0 then D1=1 and if sign(A−B)<0 then D1=0. If sign(A−B)=0, then D1=X or is logically undefined. Accordingly, data bit D0 is sent differentially using wires C and D and data bit D1 is sent differentially using wires A and B. Because the data bits are sent differentially, there is no need for a reference voltage to determine the data bit values.

The clock signal is embedded within the signals transmitted on the wires A through D. Transmitting the clock signal is accomplished by transmitting the clock signal on the common-mode of the wire pairs A,B and C,D. The clock signal is transmitted such that a differential is defined in the common-mode voltages of the wires. For example, when (A+B)/2>(C+D)/2, the clock signal is received as a logic 1. When (A+B)/2<(C+D)/2, the clock signal is received as a logic 0. When (A+B)/2=(C+D)/2, the clock signal is undefined.

Figure 4:
FIG. 4 is a chart showing the codes of FIG. 3 remaining after the undefined values have been eliminated.

The undefined logic values for the data bits D0 and D1 and the clock signal enable several of the codes from the chart 300 to be eliminated. FIG. 4 is a chart 400 showing the codes remaining after the undefined logic values have been eliminated. There are eight remaining code combinations, which is precisely the number required to send two bits of data and a clock signal using the same four wires. The communications may be expressed as the data bits being transmitted using the differential mode on wire pairs A,B and C,D, and the clock signal being transmitted using the common-mode difference between the pairs A,B and C,D.

Figure 5:
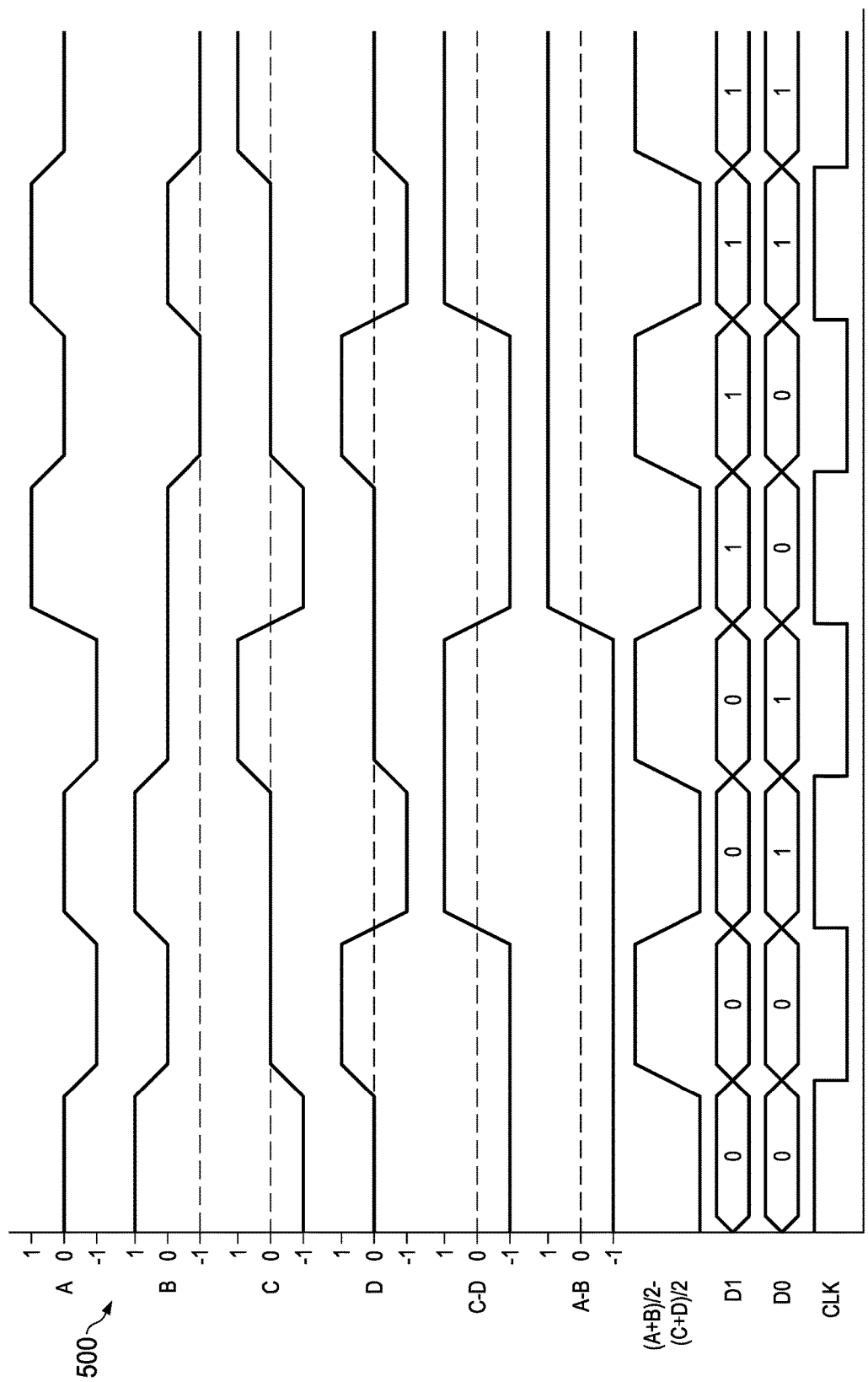
FIG. 5 is a chart showing different values on the four data lines and the resulting logic levels.

FIG. 5 is a chart 500 showing different values or voltages on the four data lines A through D and the resulting logic levels. As shown in FIG. 5, the clock continuously cycles between high and low levels and any data values for data bits D0 and D1 are able to be transmitted by the four wires A through D.

Figure 6:
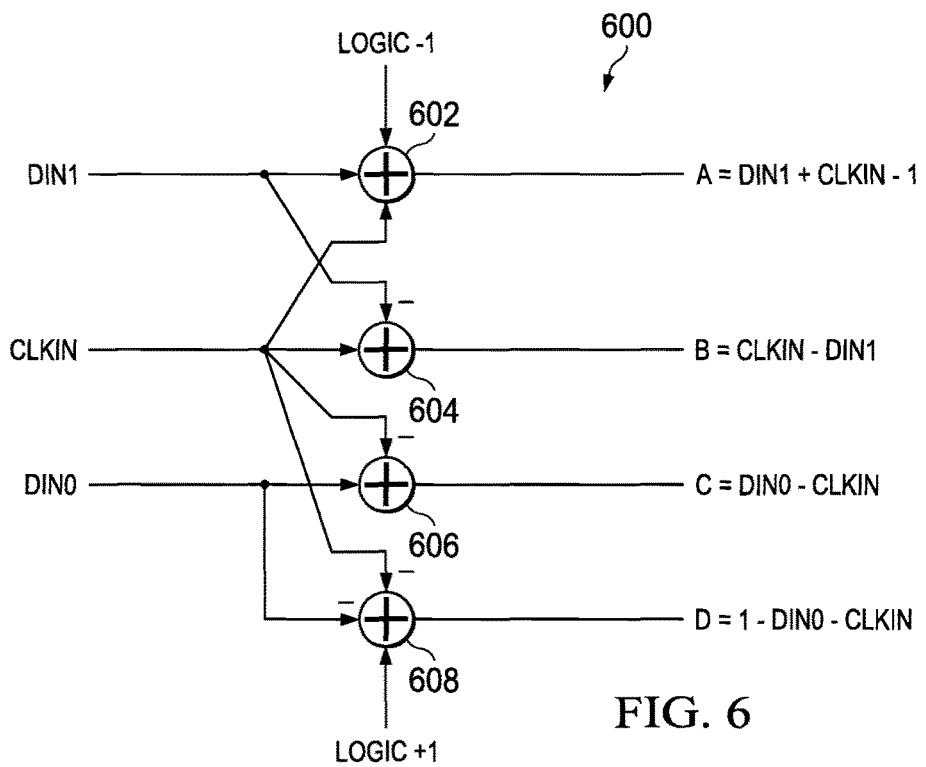
FIG. 6 is an example circuit configuration of a transmitter 600 that generates the voltages or signals on the four wires for the above-described communications.

FIG. 6 is an example circuit configuration of a transmitter 600 that generates the voltages or signals on the four wires for the above-described communications. The transmitter 600 has three inputs for the data bits D0 and D1 and the clock signal, which are referred to as DIN0, DIN1, and CLKIN, respectively. The transmitter 600 further includes a first adder 602, a second adder 604, a third adder 606, and a fourth adder 608. The output of the first adder 602 is the signal or voltage on wire A, the output of the second adder 604 is the signal on wire B, the output of the third adder 606 is the signal on wire C, and the output of the fourth adder 602 is the signal on wire D.

The first adder 602 receives inputs from DIN1, CLKIN, and logic −1. When these signals are added together, they generate the signal on the A wire, which is DIN1+CLKIN−1. The second adder 604 receives inputs from DIN1 and CLKIN to generate the signal on wire B, which is CLKIN−DIN1. The third adder 606 receives inputs from DIN0 and CLKIN to generate the signal on wire C, which is DIN0−CLKIN. The fourth adder 608 receives inputs from DIN0, CLKIN, and a logic 1 to generate the signal on wire D, which is 1−DIN0−CLKIN. The signals DIN1, DIN0, and CLKIN have three levels or voltages. In some examples, the voltages are +1.8V, +1.6V, and +1.4V, which correspond to logic levels +1, 0, and −1 respectively.

Figure 7:
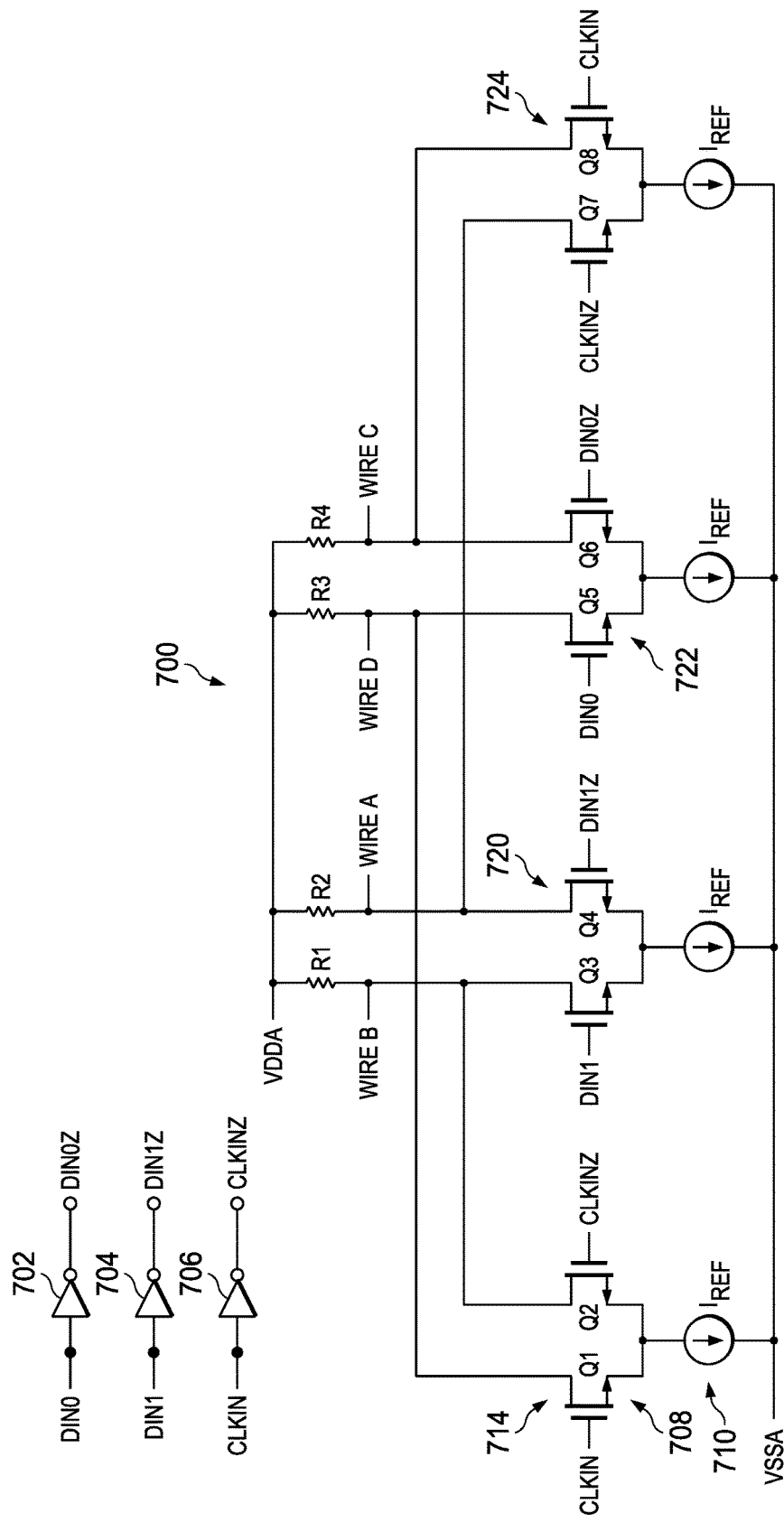
FIG. 7 is a detailed schematic diagram of an example transmitter for generating three signal levels on four wires.

FIG. 7 is a detailed schematic diagram of an example transmitter 700 for generating three signal levels on four wires. Specifically, the transmitter 700 receives inputs DIN0, DIN1 and CLKIN and generates four outputs for wires A through D. The transmitter 700 includes inverters 702, 704, and 706 that invert the signals DIN0, DIN1, and CLKIN to DIN0Z, DIN1Z, and CLKINZ.

The transmitter 700 includes a plurality of differential pairs 708, each consisting of a pair of transistors, which in the example of FIG. 7 are field-effect transistors (FETs). Each of the differential pairs 708 is coupled to a current source 710 that drives a current $I_{REF}$ to a source VSSA. In the example of FIG. 7, the current $I_{REF}$ is 100 uA. The transmitter 700 includes four resistors R1, R2, R3, and R4 that are coupled between a power source VDDA and the outputs of wires A through D.

A first differential pair 714 includes transistors Q1 and Q2 wherein the gate of transistor Q1 is coupled to CLKIN and the gate of transistor Q2 is coupled to CLKINZ. The drain of transistor Q1 is coupled to resistor R3, which is also coupled to the output wire D. The drain of transistor Q2 is coupled to resistor R1, which is also coupled to the output wire B. The sources of transistors Q1 and Q2 are coupled to one of the current sources 710 to draw a combined current of $I_{REF}$ through the differential pair 714.

A second differential pair 720 includes transistors Q3 and Q4 wherein the gate of transistor Q3 is coupled to DIN1 and the gate of transistor Q4 is coupled to DIN1Z. The drain of transistor Q3 is coupled to the output wire B and the drain of transistor Q4 is coupled to the output wire A. The sources of transistors Q3 and Q4 are coupled to one of the current sources 710 to draw a combined current of $I_{REF}$ through the differential pair 720.

A third differential pair 722 includes transistors Q5 and Q6 wherein the gate of transistor Q5 is coupled to DIN0 and the gate of transistor Q6 is coupled to DIN0Z. The drain of transistor Q5 is coupled to the output wire D and the drain of transistor Q6 is coupled to the output wire C. The sources of transistors Q5 and Q6 are coupled to one of the current sources 710 to draw a combined current of $I_{REF}$ through the differential pair 722.

A fourth differential pair 724 includes transistors Q7 and Q8 wherein the gate of transistor Q7 is coupled to CLKINZ and the gate of transistor Q8 is coupled to CLKIN. The drain of transistor Q7 is coupled to the output wire A and the drain of transistor Q8 is coupled to the output wire C. The sources of transistors Q7 and Q8 are coupled to one of the current sources 710 to draw a combined current of $I_{REF}$ through the differential pair 724.

The differential pairs 708 provide the adders shown in FIG. 6 to generate the above described signals on the output wires A through D. In the examples of FIG. 7, the resistors R1-R4 all have values of 2k Ohm and the reference currents $I_{REF}$ are 100 uA. This combination generates the 200 mV differences between the 1.8V, 1.6V, and 1.4V voltage levels on the wires A through D.

Figure 8:
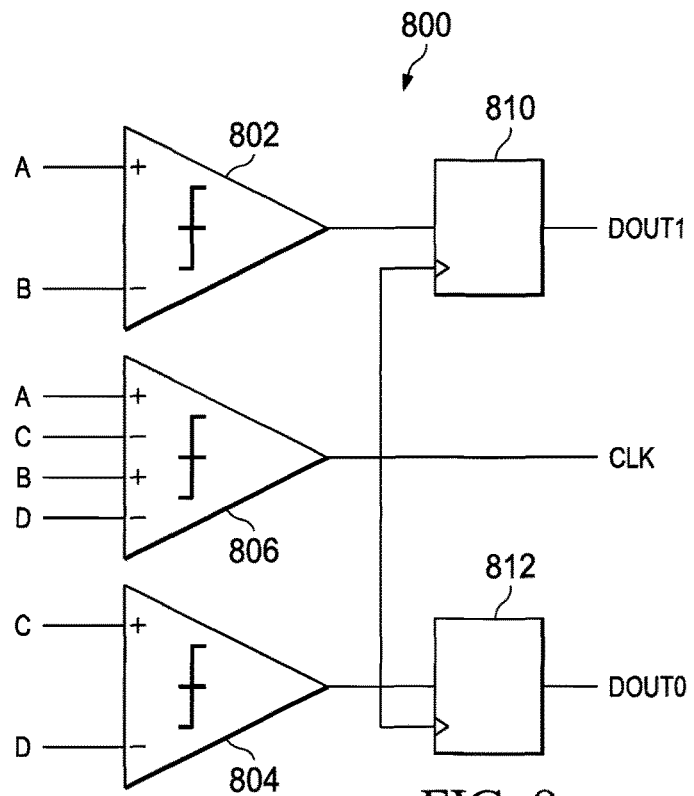
FIG. 8 is a block diagram of a circuit that translates the data on the four-wire communication system.

FIG. 8 is a block diagram of a circuit 800 that translates the data on the four-wire communication system to the data bits D0, D1, and the clock signal. The circuit 800 extracts both the clock signal and the data from the four wires A through D by analyzing the data on the four wires. The circuit 800 includes a first comparator 802, a second comparator 804, and a third comparator 806 that are coupled to the wires A through D. The comparators are referred to as decoders and may be substituted by other decoding devices that perform the functions described herein. The non-inverting inputs of the first and second comparators 802 and 804 are coupled to the wires A and C, respectively. The inverting inputs of the first and second comparators 802 and 804 are coupled to the wires B and D, respectively. The output of the first comparator 802 is the data bit D1 on a line DOUT1 and the output of the second comparator 802 is the data bit D0 on a line DOUT0. More specifically, the data bit D1 is sign(A−B) and the data bit D0 is sign(C−D).

The third comparator 806 generates the clock signal as sign(A+B−(C+D)). More specifically, the third comparator 806 compares (A+B) to (C+D) and generates the clock signal on an output CLK. If (A+B) is greater than (C+D), then the clock signal is positive. If (A+B) is less than (C+D), then the clock signal is negative. The clock signal also registers the D1 and D0 outputs. For example, the output of the first comparator 802 is input to a first flip-flop 810 and the output of the second comparator 804 is input to a second flip-flop 812. In the example of FIG. 8, the first and second flip-flops 810 and 812 are double-edge triggered flip-flops (DETFF) as described below. The transition of the clock signal passes the data bits D0 and D1 through the flip-flops 810 and 812. Accordingly, the data output of the circuit 800 is synchronized with the clock signal.

Figure 9:
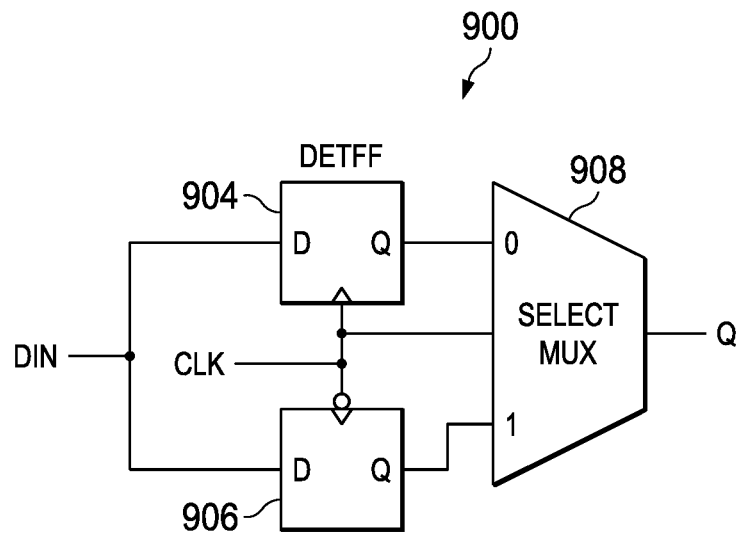
FIG. 9 is a block diagram of one of the DETFFs of FIG. 6.

FIG. 9 is a block diagram of a DETFF 900 that is representative of one of the DETFFs 810 or 812 from FIG. 8. The DETFF 900 uses the clock signal operating at a frequency f to register the data (DIN) operating at a frequency 2 f. For example, the data DIN could operate or transfer at a rate of 2.0 Gbps and the clock operates at 1.0 GHz. The DETFF 900 includes a first D/Q flip-flop 904, a second D/Q flip-flop 906, and a multiplexor 908. The clock signal is coupled to the selection of the flip-flops 904 and 906, wherein the clock signal is inverted into the second flip-flop 906. The clock signal is also the selection input for the multiplexor 908. When the clock signal transitions high, the data at the first flip-flop 904 is passed to the output Q. When the clock signal transitions low, the data at the second flip-flop 906 is passed to the output Q. Accordingly, the data is passed on every clock signal transition.

Figure 10:
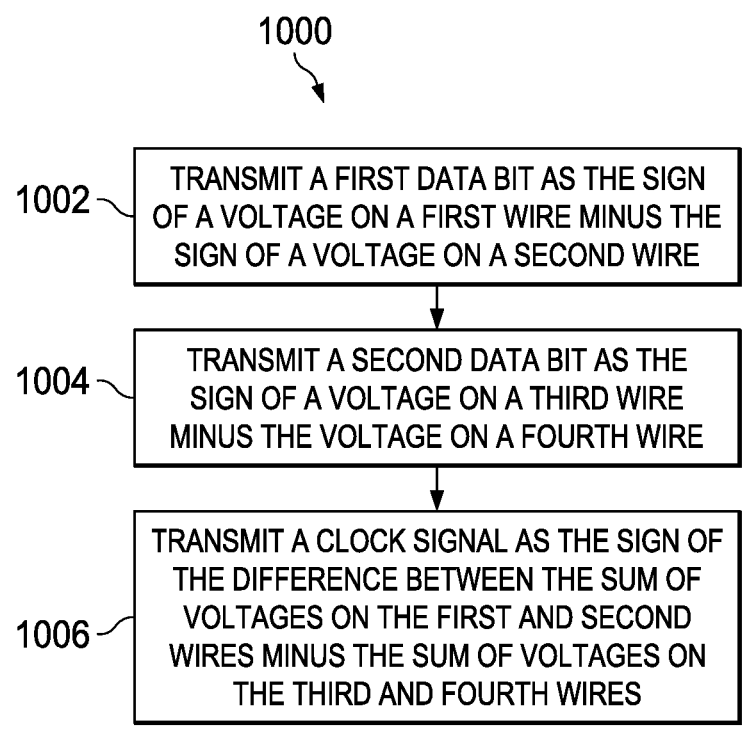
FIG. 10 is a flow chart describing a method of transmitting data on a four-wire system.

FIG. 10 is a flow chart 1000 describing a method of transmitting data on a four-wire system. The method includes transmitting a first data bit as the sign of a voltage on a first wire minus the voltage on a second wire in step 1002. Step 1004 includes transmitting a second data bit as the sign of a voltage on a third wire minus the voltage on a fourth wire. Step 1006 includes transmitting a clock signal as the sign of the difference between the sum of voltages on the first and second wires minus the sum of voltages on the third and fourth wires.

While some examples of digital receivers and methods for transmitting data have been described in detail herein, it is to be understood that the inventive concepts may be otherwise variously embodied and employed and that the appended claims are intended to be construed to include such variations except insofar as limited by the prior art.

What is claimed is:

1. A digital receiver for decoding input data, the input data having three states, the receiver comprising:
    a first input coupled to a first data line;
    a second input coupled to a second data line;
    a third input coupled to a third data line;
    a fourth input coupled to a fourth data line;
    a first comparator coupled to a first output, wherein the first comparator outputs first data connected to a sign of input data on the first data line minus input data on the second data line; and
    a second comparator coupled to a second output, wherein the second comparator outputs second data connected to a sign of input data on the third data line minus input data on the fourth data line;
    a third comparator coupled to a clock output, wherein the third comparator is for outputting a clock signal connected to data on the first data line, the second data line, the third data line, and the fourth data line;
    a first flip-flop coupled to the first output and the clock output;
    a second flip-flop coupled to the second output and the clock output;
    wherein the third comparator outputs a clock signal connected to a sign of the sum of the data on the first and second data lines minus the sum of the data on the third and fourth data lines;
    wherein the first comparator has a non-inverting input coupled to the first input and an inverting input coupled to the second input;

wherein the second comparator has a non-inverting input coupled to the third input and an inverting input coupled to the fourth input;

wherein the data transmitted on the data lines is configured so that the data on the first data line minus the data on the second data line is either a −1 or a +1 and wherein the data transmitted on the third data line minus the data on the fourth data line is either a −1 or a +1.

2. The receiver of claim 1, wherein the data transmitted on the data lines are voltages.

3. The receiver of claim 1, wherein the data transmitted on the data lines is 1.4 volts, 1.6 volts, and 1.8 volts.

* * * * *